(12) United States Patent
Shy et al.

(10) Patent No.: US 6,592,400 B2
(45) Date of Patent: Jul. 15, 2003

(54) EASILY ASSEMBLED FAN STRUCTURE FEASIBLE FOR HOT SWAP

(75) Inventors: Alex Shy, Taipei (TW); Shou-Te Yu, Taoyuan (TW); Chih-Yuan Lin, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 09/940,370

(22) Filed: Aug. 29, 2001

(65) Prior Publication Data

US 2002/0025727 A1 Feb. 28, 2002

Related U.S. Application Data

(63) Continuation-in-part of application No. 09/385,329, filed on Aug. 30, 1999.

(51) Int. Cl.[7] ................................................ H01R 13/60
(52) U.S. Cl. ...................................... 439/527; 439/532
(58) Field of Search ................................ 439/289, 660, 439/297, 298, 417, 527, 532, 325, 630; 361/695, 697, 831; 174/17 R, 16.1

(56) References Cited

U.S. PATENT DOCUMENTS

| | | | | |
|---|---|---|---|---|
| 5,101,321 A | | 3/1992 | Remise et al. | 361/384 |
| 5,155,663 A | | 10/1992 | Harase | 361/395 |
| 5,370,551 A | * | 12/1994 | Data | 439/487 |
| 5,742,478 A | | 4/1998 | Wu | 361/704 |
| 5,790,660 A | | 8/1998 | Vlaeminck | 379/442 |
| 5,869,818 A | | 2/1999 | Kim | 219/757 |
| 5,975,919 A | | 11/1999 | Arnett et al. | 439/82 |

* cited by examiner

*Primary Examiner*—Lynn Feild
*Assistant Examiner*—Son V. Nguyen

(57) ABSTRACT

A fan feasible for hot swap in a system is disclosed. The fan includes a contact device having contact terminals welded to a flat plate member. The contact terminals have respective one ends thereof welded to the conductive wire of the rotor device of the fan, and the other ends remain free. The free ends allow the fan to be electrically connected to the system in a contact manner so as to be easily replaced. The flat plate member is attached to a fan guard of the fan in a sliding manner or a snap-engagement manner without any auxiliary tool.

18 Claims, 7 Drawing Sheets

EASILY ASSEMBLED FAN STRUCTURE FEASIBLE FOR HOT SWAP

This application is a continuation-in-part application of the pending application Ser. No. 09/385,329 filed Aug. 30, 1999.

FIELD OF THE INVENTION

The present invention relates to a fan feasible for hot swap, and particularly to a fan structure which can be easily assembled and advantageous for hot swap.

BACKGROUND OF THE INVENTION

A heat-dissipating device, e.g. a fan, is usually mounted to a system for basically radiating the heat generated due to the operation of the system. Furthermore, the fan can be designed to be feasible for hot swap by being mounted thereon contact terminals for transmitting power or signals from or to the system. In other words, the fan is electrically connected to the system in a terminal-contact manner rather than a terminal-welding manner so that the fan can be detached and replaced from the system easily and quickly in case of malfunction, test or maintenance without shutting off the system.

Please refer to FIG. 1 which is a perspective diagram schematically showing a conventional fan structure feasible for hot swap. The fan includes a rotor device 10 for generating airflow by revolution, a contact device 11 for performing a hot swap function, and a fan guard 12 for supporting the rotor device 10 and the contact device 11. The contact device 11 will be illustrated in detail by referring to FIG. 2.

As shown in FIG. 2, the contact device 11 includes a main body 21, a screwing member 22, an indicating member 23, and a conductive member 24. The indicating member 23 is generally a light emitting diode (LED) for indicating the operational situation of the fan. The conductive member 24 includes a plurality of contact terminals 241 individually secured onto the main body 21. The contact terminals have respective one ends thereof welded to the conductive wire (not shown) of the rotor device 10, and respective the other ends thereof in electric contact with contact terminals of the system (not shown) for transmitting power or signals between the system and the rotor device 10. The indicating member 23 and the conductive member 24 are engaged into the main body 21, and then mounted on the fan guard 12 via the screwing member 22 (see FIG. 1).

The above-mentioned fan for hot swap, however, has the following disadvantages. First of all, the assembling operation of the contact device is complicated and the resulting cost is high owing to the involvement of various separate elements. In addition, the mounting of the contact device to the fan guard by screwing is inconvenient.

SUMMARY OF THE INVENTION

Therefore, an object of the present invention is to provide a heat-dissipating fan, in which the contact device for hot swap is simple in structure so as to be easily produced and cost-efficient.

Another object of the present invention is to provide a heat-dissipating fan, in which the contact device for hot swap can be mounted to the main structure of the heat-dissipating device easily.

A first aspect of the present invention relates to a heat-dissipating fan feasible for hot swap in a system. The fan includes a rotor device for generating an airflow by revolution in order to dissipate heat from the system; a fan guard positioned around the rotor device for protecting and supporting the rotor device, and including two guard pieces arranged at opposite sides of the rotor device. The fan further includes a contact device engaging with the fan guard for electrically connecting the rotor device to the system therethrough, and the contact device includes a plate member of a substantially flat shape bridged between the two guard pieces; and a conductive member penetrating through the through-hole structure, and having a first and a second ends thereof exposing from two opposite sides of the plate member, respectively. The first end is electrically connected to the rotor device, and the second end remains free, thereby electrically connecting the rotor device to the system. The fan further includes a coupling device arranged between the plate member and the guard pieces for enabling engagement of the contact device with the fan guard. The coupling device includes a first coupling member integrally formed with the plate member, and a second coupling member integrally formed with the guard pieces. The first and second coupling members engage with each other to complete engagement of the contact device with the fan guard.

The plate member can be a printed circuit board or an insulation plate.

In an embodiment, the plate member includes a through hole structure, and the conductive member includes a plurality of contact terminals welded to the plate member at positions corresponding to a plurality of through holes of the through-hole structure.

In another embodiment, the plate member includes a circuit, and the conductive member includes a plurality of contact terminals electrically connected to the rotor device and the circuit.

The first end of the conductive member can be electrically connected to the rotor device by direct welding to a conductive wire of the rotor device. Alternatively, the first end of the conductive member is electrically connected to the rotor device by indirect welding to a conductive wire of the rotor device via a circuit on the plate member. Further, the first end of the conductive member can be electrically connected to the rotor device via an insulation displacement connector (IDC).

In an embodiment, the first coupling member includes at least two ear pieces protruding from two opposite sides of the plate member, respectively, and the second coupling member includes two guiding slots opposite to each other for receiving the ear pieces.

In another embodiment, the first coupling member includes a securing piece and a recess formed on opposite sides of the plate member, respectively, and the second coupling member includes a trench and a post formed on the two guarding pieces, respectively, at positions corresponding to the securing piece and the recess in order to allow the plate member to be bridged between the two guard pieces by inserting the securing piece into the trench, and snap-engaging the post with the recess.

In a further embodiment, the first coupling member includes a securing piece and a post formed on opposite sides of the plate member, respectively, and the second coupling member includes a trench and a recess formed on the two guarding pieces, respectively, at positions corresponding to the securing piece and the post in order to allow the plate member to be bridged between the two guard pieces by inserting the securing piece into the trench, and snap-engaging the post with the recess.

Preferably, the fan further includes a cover made of an insulating material and mounted outside the plate member for protecting and/or isolating the contact device. The cover has an opening at a position corresponding to the conductive member for exposing therefrom the second end of the conductive member for electric contact with the system.

According to the present invention, the second end of the conductive member optionally protrudes or indents from or is leveled with a surface of the plate member.

In accordance with a second aspect of the present invention, a heat-dissipating fan feasible for hot swap in a system includes a rotor device for generating an airflow by revolution in order to dissipate heat from the system; a fan guard positioned around the rotor device for protecting and supporting the rotor device, and including two guard pieces arranged at opposite sides of the rotor device; and a contact device engaging with the fan guard for electrically connecting the rotor device to the system therethrough. The contact device includes a plate member of a substantially flat shape bridged between the two guard pieces, and including a circuit thereon; and a conductive member electrically connected to the circuit and the rotor device, and having a free end exposing from a side of the plate member, thereby electrically connecting the rotor device to the system by locating the free end of the conductive member at a specific position in the system, and disconnecting the rotor device from the system by dislocating the free end. The fan further includes a coupling device arranged between the plate member and the guard pieces for enabling engagement of the contact device with the fan guard. The coupling device including a first coupling member integrally formed with the plate member, and a second coupling member integrally formed with the guard pieces. The first and second coupling members engage with each other to complete engagement of the contact device with the fan guard.

According to a third aspect of the present invention, the heat-dissipating fan feasible for hot swap in a system includes a rotor device for generating an airflow by revolution in order to dissipate heat from the system; a fan guard positioned around the rotor device for protecting and supporting the rotor device, and integrally formed of an insulation material, the fan guard including a first and a second guard pieces arranged at opposite sides of the rotor device, and a third guard piece bridged between the first and second guard pieces for mounting thereon a plurality of contact terminals for electrically connecting the rotor device to the system therethrough.

BRIEF DESCRIPTION OF THE DRAWING

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Herein, the present invention is illustrated by using a fan as a heat-dissipating device.

Figure 1:
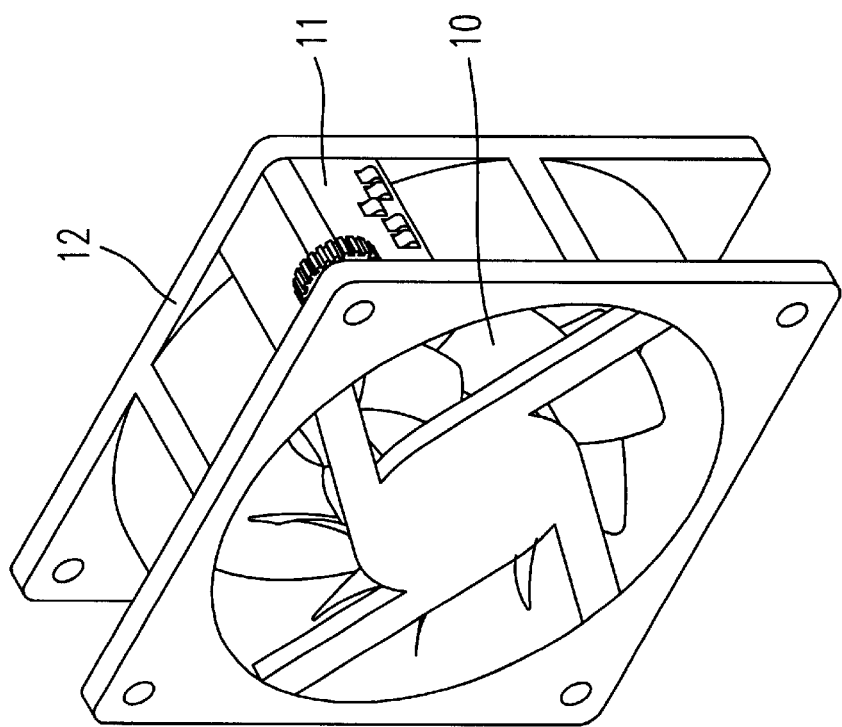
FIG. 1 is a perspective diagram schematically showing a conventional fan feasible for hot swap.
Figure 2:
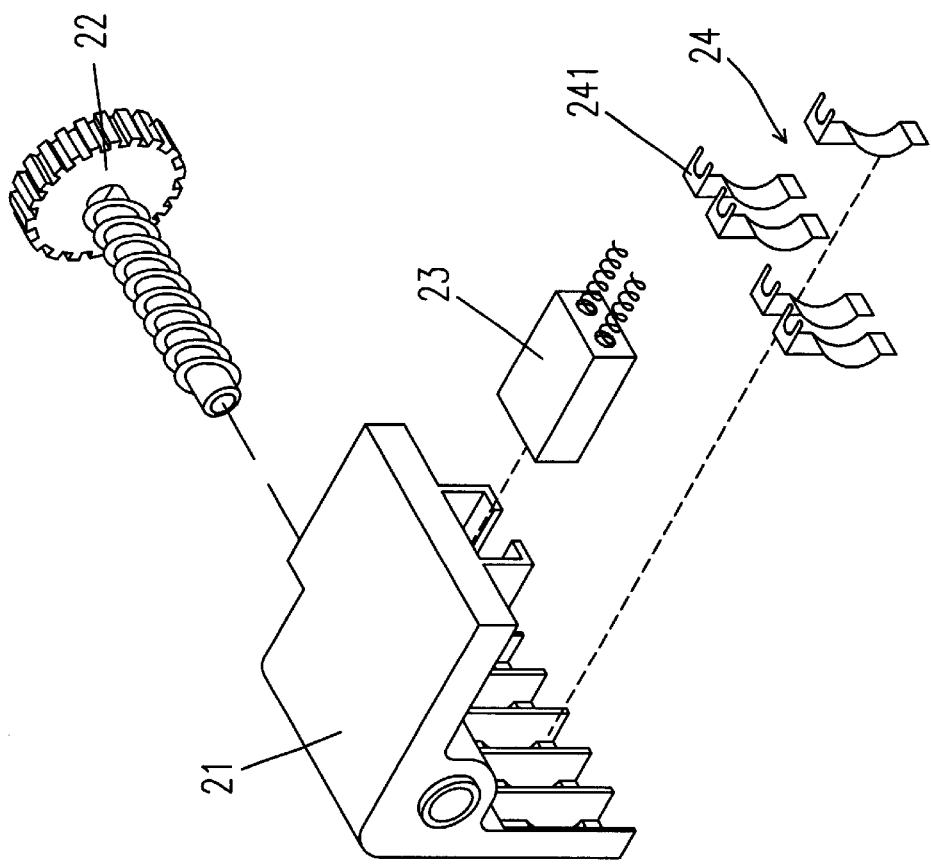
FIG. 2 is a resolving diagram schematically showing a contact device of the conventional fan of FIG. 1.
Figure 3:
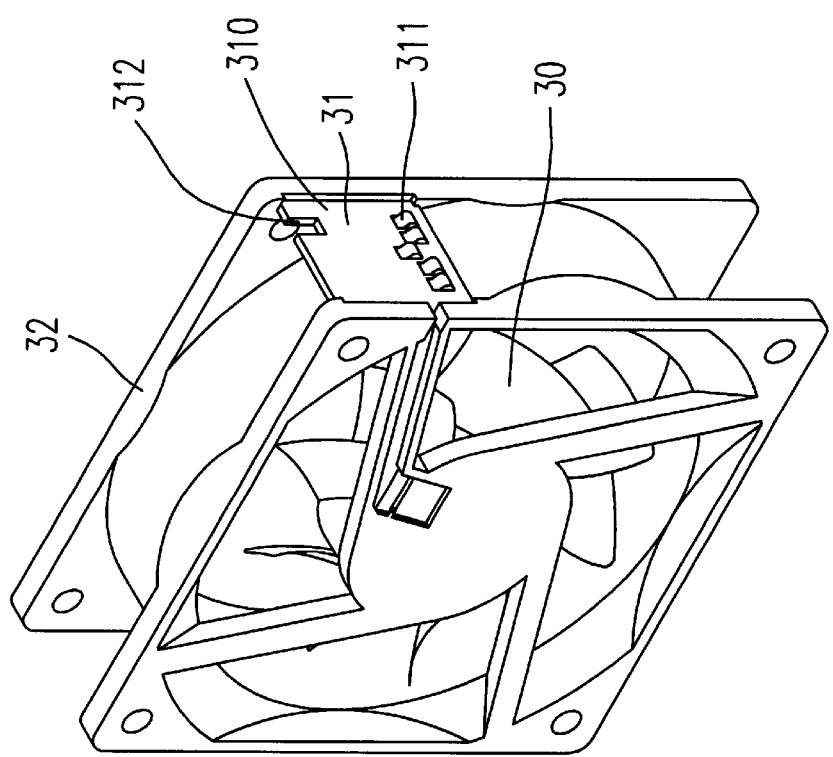
FIG. 3 is a perspective diagram schematically showing a preferred embodiment of a fan feasible for hot swap according to the present invention.

Please refer to FIG. 3 which is a perspective diagram schematically showing a first preferred embodiment of a fan feasible for hot swap according to the present invention. The fan includes a rotor device 30 for generating airflow by revolution, a contact device 31 for performing a hot swap function, and a fan guard 32 for supporting the rotor device 30 and the contact device 31. The contact device 31 includes a plate member 310, and a plurality of contact terminals 311 welded onto the plate member 310. An indicating member such as an LED (not shown) is preferably mounted onto the contact device 31 at the recess portion 312 for indicating the operational situation of the fan. In this embodiment, the plate member 310 and the fan guard 32 are integrally formed by injection molding, and the terminals 311 are then welded to the plate member 310. By this way, no assembling procedure is required for mounting the contact device 31 to the fan guard 32.

Figure 4:
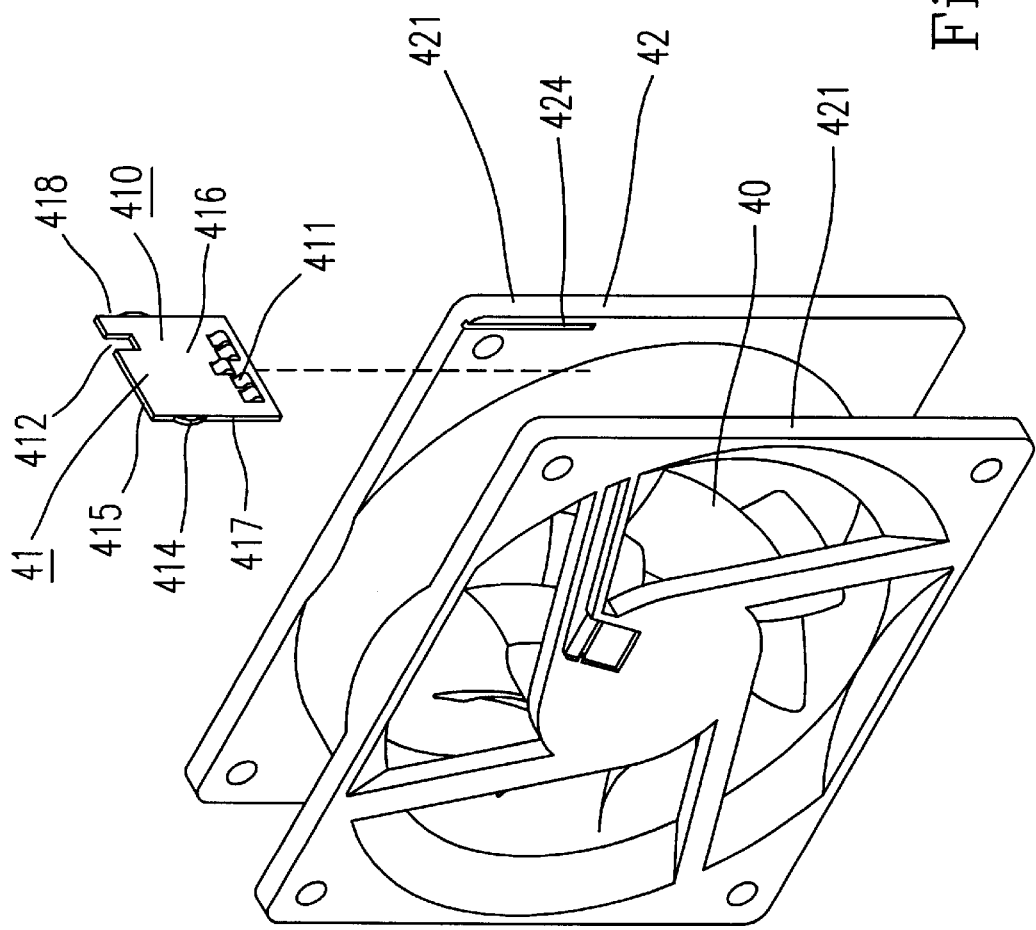
FIG. 4 is a perspective diagram schematically showing another preferred embodiment of a fan feasible for hot swap according to the present invention.

Please refer to FIG. 4 which is a perspective diagram schematically showing a second preferred embodiment of a fan feasible for hot swap according to the present invention. The fan includes a rotor device 40 for generating airflow by revolution, a contact device 41 for performing a hot swap function, and a fan guard 42 for supporting the rotor device 40 and the contact device 41. The fan guard 42 includes a pair of parallel guard pieces 421. The contact device 41 includes a plate member 410, and a plurality of contact terminals 411 welded onto the plate member 410, and exposed from the both opposite sides 415 and 416 of the plate member 410. An indicating member such as an LED (not shown) is preferably mounted onto the contact device 41 at the recess portion 412 for indicating the operational situation of the fan. The plate member 410 can be a printed circuit board having existent circuit thereon or an insulation plate specific for receiving the contact terminals, depending on the control design of the fan. The conductive wire (not shown) of the rotor device 40 is welded to the contact terminals 411 protruding from the inner side 415 of the plate member 410. Alternatively, the conductive wire can be electrically connected to the contact terminals 411 via the existent circuit of the plate member 410. The contact terminals 411 protruding from the outer side 416 are remained free so as to be electrically connected to the system in an electric contact manner. It is understood that the free ends of the contact terminals can protrude from, indent from or be leveled with a surface of the plate member as long as the contact terminals of the system where the fan is applied have corresponding shapes. For example, if the free ends of the contact terminals indent from the surface, it is preferred that the contact terminals of the system is convex so as to make good electric contact. On the other hand, if the free ends of the contact terminals protrude from the surface, it is preferred that the contact terminals of the system is concave or flat. Further, the contact terminals of the fan are optionally arranged on a lateral side or a bottom surface of the fan guard, depending on the positions of the system terminals on the system frame. The electric connection of the conductive wire of the rotor device 40 to the contact terminals 411 and the electric contact between the contact terminals 411 and the system contact terminals allow power and/or signals to be transmitted between the system and the rotor device.

In the embodiment shown in FIG. 4, the contact device 41 is detachably engaged with the fan guard 42 by two ear pieces 414 integrally formed and protruding from two opposite sides 417 and 418 of the plate member 410, respectively, and two corresponding guiding slots 424 integrally formed on the guard pieces 421. The ear pieces 414 slides into the fan guard 42 between the guard pieces along the guiding slots 424 so as to attach the contact device 41 to the fan guard 42. It is understood that the number of the ear pieces 414 is not limited to two. More than two ear pieces, symmetrically or asymmetrically arranged on the two opposite sides of the plate member, are acceptable as long as the contact device 41 and the fan guard 42 can be easily combined via the engagement of the ear pieces 414 and the guiding slots 424.

Figure 5:
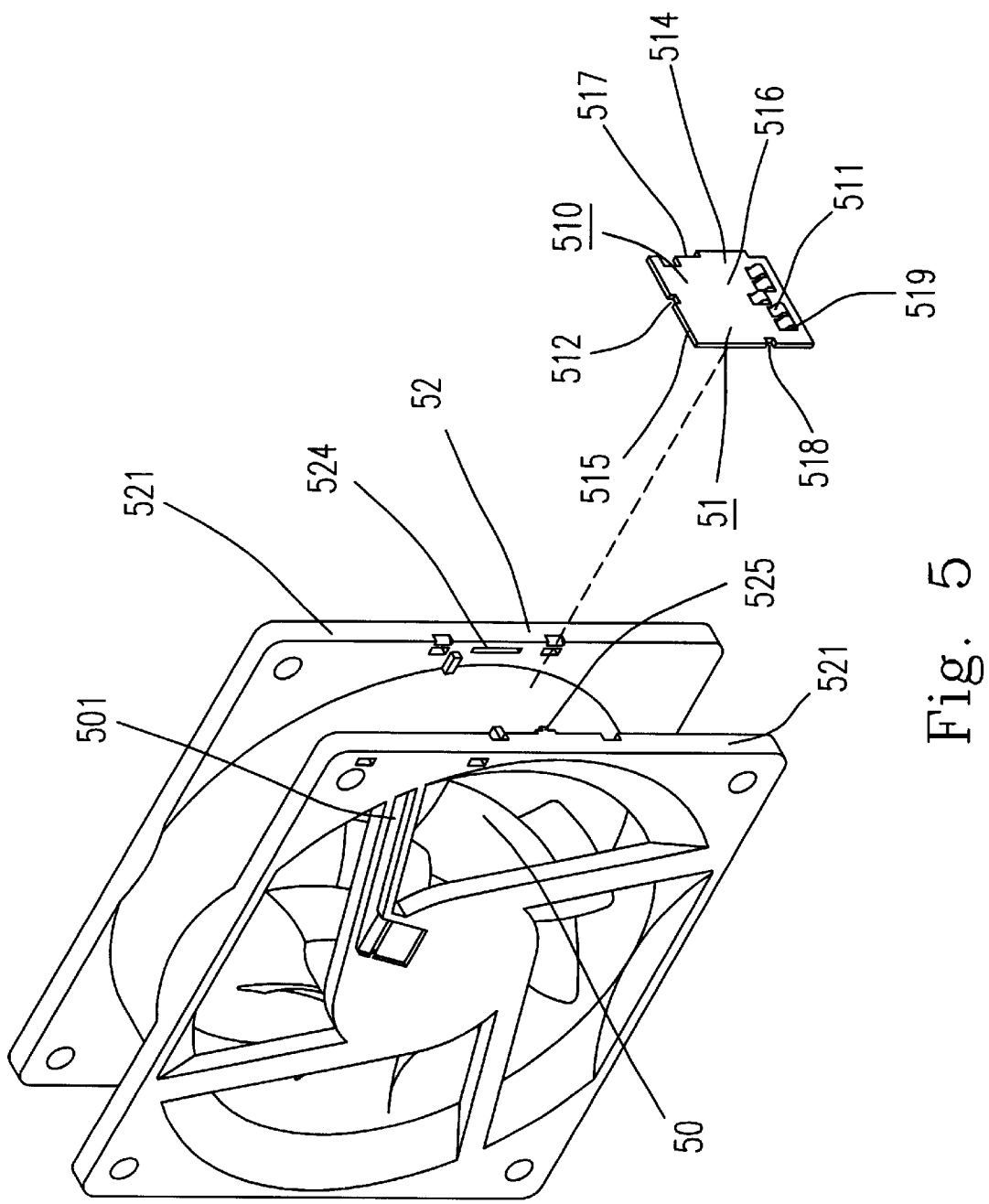
FIG. 5 is a perspective diagram schematically showing a further preferred embodiment of a fan feasible for hot swap according to the present invention.

Please refer to FIG. 5 which is a perspective diagram schematically showing a third preferred embodiment of a fan feasible for hot swap according to the present invention. The fan includes a rotor device 50 for generating airflow by revolution, a contact device 51 for performing a hot swap function, and a fan guard 52 for supporting the rotor device 50 and the contact device 51. The contact device 51 includes a plate member 510 having a plurality of through holes 519, and a corresponding number of contact terminals 511 welded into the through holes 519, respectively, and exposed from the both opposite sides 515 and 516 of the plate member 510. An indicating member such as an LED (not shown) is preferably mounted onto the contact device 51 at the recess portion 512 for indicating the operational situation of the fan. The plate member 510 can be a printed circuit board having existent circuit thereon or an insulation plate specific for receiving the contact terminals, depending on the control design of the fan. The conductive wire (not shown) of the rotor device 50 is guided along a track 501 to be electrically connected to the contact terminals 511 e.g. by way of direct welding to the contact terminals 511 or indirect welding to the contact terminals via the existent circuit of the circuit board. The contact terminals 511 protruding from the outer side 516 are remained free so as to be electrically connected to the system in an electric contact manner. The welding of the conductive wire of the rotor device 50 to the contact terminals 511 and the electric contact between the contact terminals 511 and the system contact terminals allow power and/or signals to be transmitted between the system and the rotor device.

In the embodiment shown in FIG. 5, the contact device 51 is detachably engaged with the fan guard 52 by a securing piece 514 integrally formed with the plate member 510 and protruding from a side 517 of the plate number 510, and a corresponding trench 524 arranged on one of the guard pieces 521 of the fan guard 52. In addition, the fan guard 52 includes a post 525 integrally formed with one of the guard pieces 521 for being received into a recess 518 of the plate member 510 at a corresponding position after the securing piece 514 is inserted into the trench 524. By this way, the contact device 51 is easily mounted to the fan guard 52 without any tool.

Figure 6:
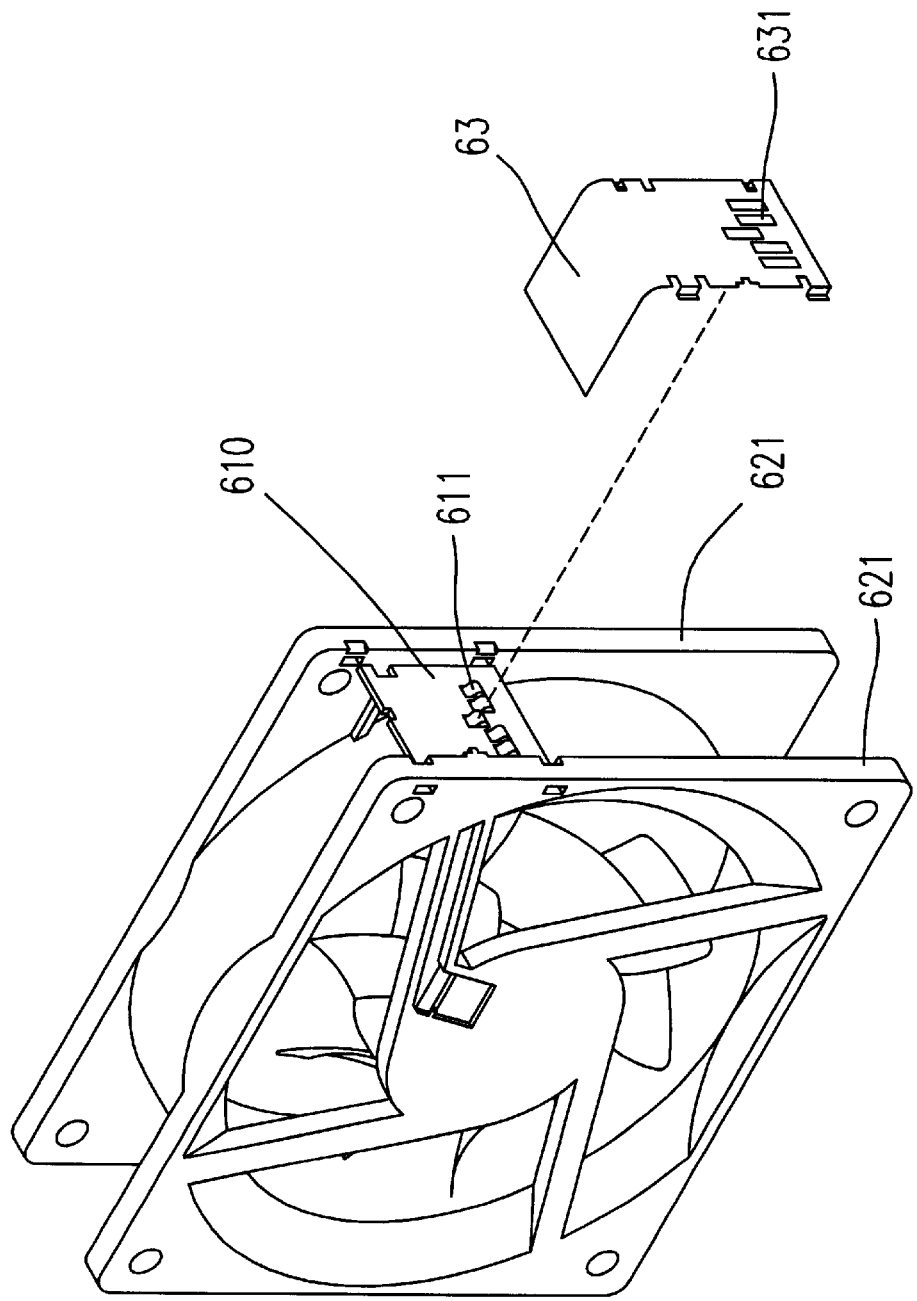
FIG. 6 schematically shows a cover provided for a fan feasible for hot swap according to the present invention to assure of the positioning of the contact device and the isolation of the PCB plate member.

It is understood that the pair number of the securing piece 514 and trench 524 is not limited to one. A second securing piece can be arranged at the same side of the first one, and inserted into the same or different trench to strengthen the coupling between the contact device and the fan guard. Two securing pieces arranged on opposite sides for being inserted into two oppositely arranged trenches are also be acceptable as long as the plate member is flexible enough to be bent properly while performing an inserting operation. Alternatively, two pairs of posts and recesses arranged on opposite sides of the plate member are acceptable. In order to avoid the posts escaping from the respective recesses, a cover 63 is preferably provided outside the plate member 610, as shown in FIG. 6. The cover 63 is mounted to the fan guard 62 between the guard pieces 621 by snap engagement, and has a plurality of openings 631 arranged at positions corresponding to the contact terminals 611 so as to expose the contact terminals for electric contact with the system contact terminals.

The cover 63 shown in FIG. 6 can also be provided for any other fan structure mentioned above in order to assure of the positioning of the contact device and the isolation of the PCB plate member.

Figure 7:
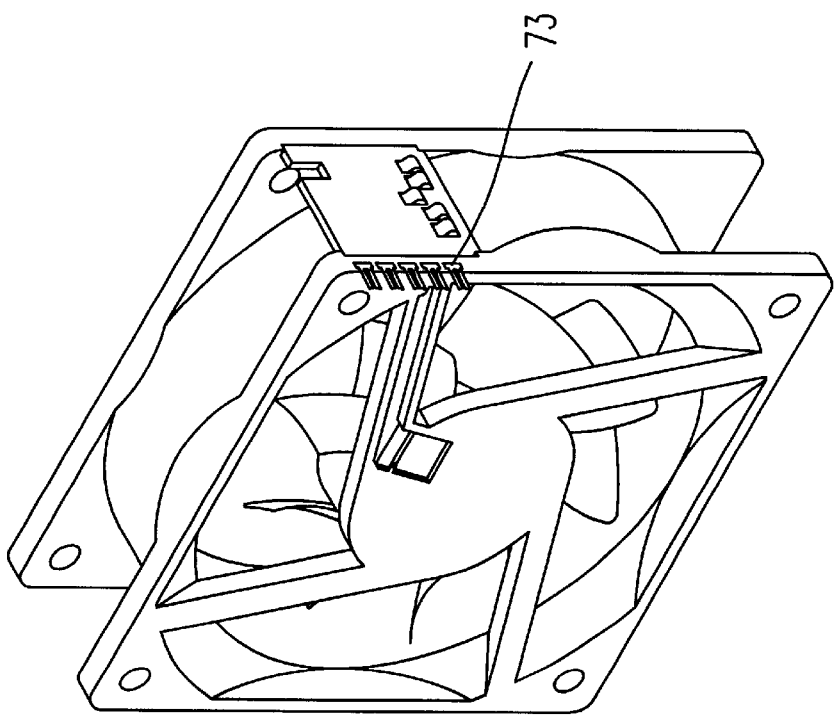
FIG. 7 schematically shows an insulation displacement connector (IDC) used for connecting the conductive wire of the rotor device with the contact terminals of the contact device to minimize bothering welding operations.

As mentioned above, the conductive wire of the rotor device 30, 40 or 50 is connected to the contact terminals 311, 411 or 511 by way of welding. Alternatively, an insulation displacement connector (IDC) 73 can be used for connecting the conductive wire with the contact terminals by plugging in, as shown in FIG. 7. By using such a connector, few bothering welding operations are required.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating fan feasible for hot swap in a system, comprising:
    a rotor device for generating an airflow by revolution in order to dissipate heat from said system;
    a fan guard positioned around said rotor device for protecting and supporting said rotor device, and including two guard pieces arranged at opposite sides of said rotor device;
    a contact device engaging with said fan guard for electrically connecting said rotor device to said system therethrough, and including:
        a plate member of a substantially flat shape bridged between said two guard pieces; and
        a conductive member secured on said plate member, and having a first and a second ends thereof exposing from two opposite sides of said plate member, respectively, said first end being electrically connected to said rotor device, and said second end remaining free,
    thereby electrically connecting said rotor device to said system; and
    a coupling device arranged between said plate member and said guard pieces for enabling engagement of said contact device with said fan guard, said coupling device including a first coupling member integrally formed with said plate member, and a second coupling member integrally formed with said guard pieces, said first and second coupling members engaging with each other to complete engagement of said contact device with said fan guard.

2. The fan according to claim 1 wherein said plate member includes a through-hole structure for penetrating therethrough said conductive member.

3. The fan according to claim 2 wherein said conductive member includes a plurality of contact terminals welded to said plate member at positions corresponding to a plurality of through holes of said through-hole structure.

4. The fan according to claim 1 wherein said plate member includes a circuit thereon, and said conductive member electrically connected to said circuit and said rotor device.

5. The fan according to claim 1 wherein said plate member is a printed circuit board.

6. The fan according to claim 1 wherein said plate member is an insulation plate.

7. The fan according to claim 1 wherein said first end of said conductive member is electrically connected to said rotor device by direct welding to a conductive wire of said rotor device.

8. The fan according to claim 1 wherein said first end of said conductive member is electrically connected to said rotor device by indirect welding to a conductive wire of said rotor device via a circuit on said plate member.

9. The fan according to claim 1 wherein said first end of said conductive member is electrically connected to said rotor device via an insulation displacement connector (IDC).

10. The fan according to claim 1 wherein said first coupling member includes at least two ear pieces protruding from two opposite sides of said plate member, respectively, and said second coupling member includes two guiding slots opposite to each other for receiving said ear pieces.

11. The fan according to claim 1 wherein said first coupling member includes a securing piece and a recess formed on opposite sides of said plate member, respectively, and said second coupling member includes a trench and a post formed on said two guarding pieces, respectively, at positions corresponding to said securing piece and said recess in order to allow said plate member to be bridged between said two guard pieces by inserting said securing piece into said trench, and snap-engaging said post with said recess.

12. The fan according to claim 1 wherein said first coupling member includes a securing piece and a post formed on opposite sides of said plate member, respectively, and said second coupling member includes a trench and a recess formed on said two guarding pieces, respectively, at positions corresponding to said securing piece and said post in order to allow said plate member to be bridged between said two guard pieces by inserting said securing piece into said trench, and snap-engaging said post with said recess.

13. The fan according to claim 1 further comprising a cover made of an insulating material and mounted outside said plate member for protecting and/or isolating said contact device, said cover having a opening at a position corresponding to said conductive member for exposing therefrom said second end of said conductive member for electric contact with said system.

14. The fan according to claim 1 wherein said second end of said conductive member protrudes from a surface of said plate member.

15. The fan according to claim 1 wherein said second end of said conductive member indents from a surface of said plate member.

16. The fan according to claim 1 wherein said second end of said conductive member is leveled with a surface of said plate member.

17. A heat-dissipating fan feasible for hot swap in a system, comprising:

a rotor device for generating an airflow by revolution in order to dissipate heat from said system;

a fan guard positioned around said rotor device for protecting and supporting said rotor device, and including two guard pieces arranged at opposite sides of said rotor device;

a contact device engaging with said fan guard for electrically connecting said rotor device to said system therethrough, and including:

a plate member of a substantially flat shape bridged between said two guard pieces, and including a circuit thereon; and a conductive member electrically connected to said circuit and said rotor device, and having a free end exposing from a side of said plate member, thereby electrically connecting said rotor device to said system by locating said free end of said conductive member at a specific position in said system, and disconnecting said rotor device from said system by dislocating said free end; and a coupling device arranged between said plate member and said guard pieces for enabling engagement of said contact device with said fan guard, said coupling device including a first coupling member integrally formed with said plate member, and a second coupling member integrally formed with said guard pieces, said first and second coupling members engaging with each other to complete engagement of said contact device with said fan guard.

18. The fan according to claim 17 further comprising a cover made of an insulating material and mounted outside said plate member for protecting and/or isolating said contact device, said cover having an opening at a position corresponding to said conductive member for exposing therefrom said second end of said conductive member for electric contact with said system.

* * * * *